United States Patent [19]
Homma et al.

[11] 4,156,941
[45] May 29, 1979

[54] HIGH SPEED SEMICONDUCTOR MEMORY

[75] Inventors: Noriyuki Homma, Kokubunji; Kunihiko Yamaguchi, Sayama, both of Japan

[73] Assignee: Hitachi, Ltd., Japan

[21] Appl. No.: 836,969

[22] Filed: Sep. 27, 1977

[30] Foreign Application Priority Data

Sep. 29, 1976 [JP] Japan .............................. 51-115852

[51] Int. Cl.² ...................... G11C 11/40; G11C 13/00
[52] U.S. Cl. .................................... 365/233; 365/154; 365/189
[58] Field of Search ....................... 365/233, 189, 154

[56] References Cited
U.S. PATENT DOCUMENTS 3,838,404   9/1974   Heeren .................................. 365/233

Primary Examiner—Terrell W. Fears
Attorney, Agent, or Firm—Craig and Antonelli

[57] ABSTRACT

A semiconductor memory capable of being operated at high speed is disclosed. Each memory cell consists of a pair of cross-coupled transistors connected between two word lines. Application of the read or write pulse to one of the word lines is detected and the signal thus detected is applied to a delay circuit. The output of the delay circuit is applied to a current switch transistor connected to the other word line for turning it on during the predetermined period of time at least just after the reading or writing cycle of the selected cell, thereby quickly clamping the word lines to the predetermined potentials.

11 Claims, 12 Drawing Figures

HIGH SPEED SEMICONDUCTOR MEMORY

LIST OF PRIOR ART C37CFR 1.56(a)

The following references are cited to show the state of the art:

Japanese laying open Pat. No. 61036/73; and Japanese laid open Pat. No. 22829/74

BACKGROUND OF THE INVENTION

The present invention relates to a semiconductor memory, and in particular to a circuit for improving the access time of a semiconductor memory.

A semiconductor memory, such as a bipolar memory, comprises a number of memory cells arranged in the form of matrix. Each cell is connected between a pair of word lines arranged in a row and a pair of digit lines arranged in a column.

When one of the memory cells is selected for writing or reading, an addressing pulse is applied to one of the word lines, which is connected to the selected cell.

The access time of this kind of memory is determined mainly by both the rising and falling time of word line potential changing in response to the addressing pulse applied thereto.

As far as the rising time of the potential on the word line is concerned, the prior art provides some successful solutions to realize a quick or abrupt rising of the potential.

However, the improvement on the falling time of the potential on the word line was considered much more difficult to achieve. In the case where a large number of memory cells are used for a memory array, it is necessary to consider the adverse effect of stray capacity between the word line and ground on the falling time of the potential on the word line. When one of the memory cells is selected for reading or writing, the word line connected thereto is switched to a high potential. This results in the stray capacity between the word line and ground being charged up. Upon the completion of a reading or writing cycle, the word line is returned to a low potential. But, due to the charge stored in the stray capcity during the reading or writing cycle, it takes a relatively long time to clamp the word line to a low potential. This slow falling of the potential on the word line prevents the memory from being operated at a high speed.

One conventional and insufficient attempt to solve this problem is to provide an additional current to the selected cell during the time that the word addressing pulse is being applied to the word line. Measurements showed, however, that the improvement by this attempt was relatively small.

SUMMARY OF THE INVENTION

One object of the present invention is to provide a semiconductor memory capable of being operated at a high speed.

Another object of the present invention is to improve the falling time of the potential on the word line at the time of the switching of the word addressing pulse applied thereto from a high level to a low level.

In accordance with these and other objects, the present invention provides that during the predetermined period of time at least immediately after the reading or writing cycle, a current switch connected to the word line is turned on. This abruptly discharges the charge stored in the stray capacity between the word line and ground.

DETAILED DESCRIPTION OF THE INVENTION

THE PRIOR ART

Figure 1:
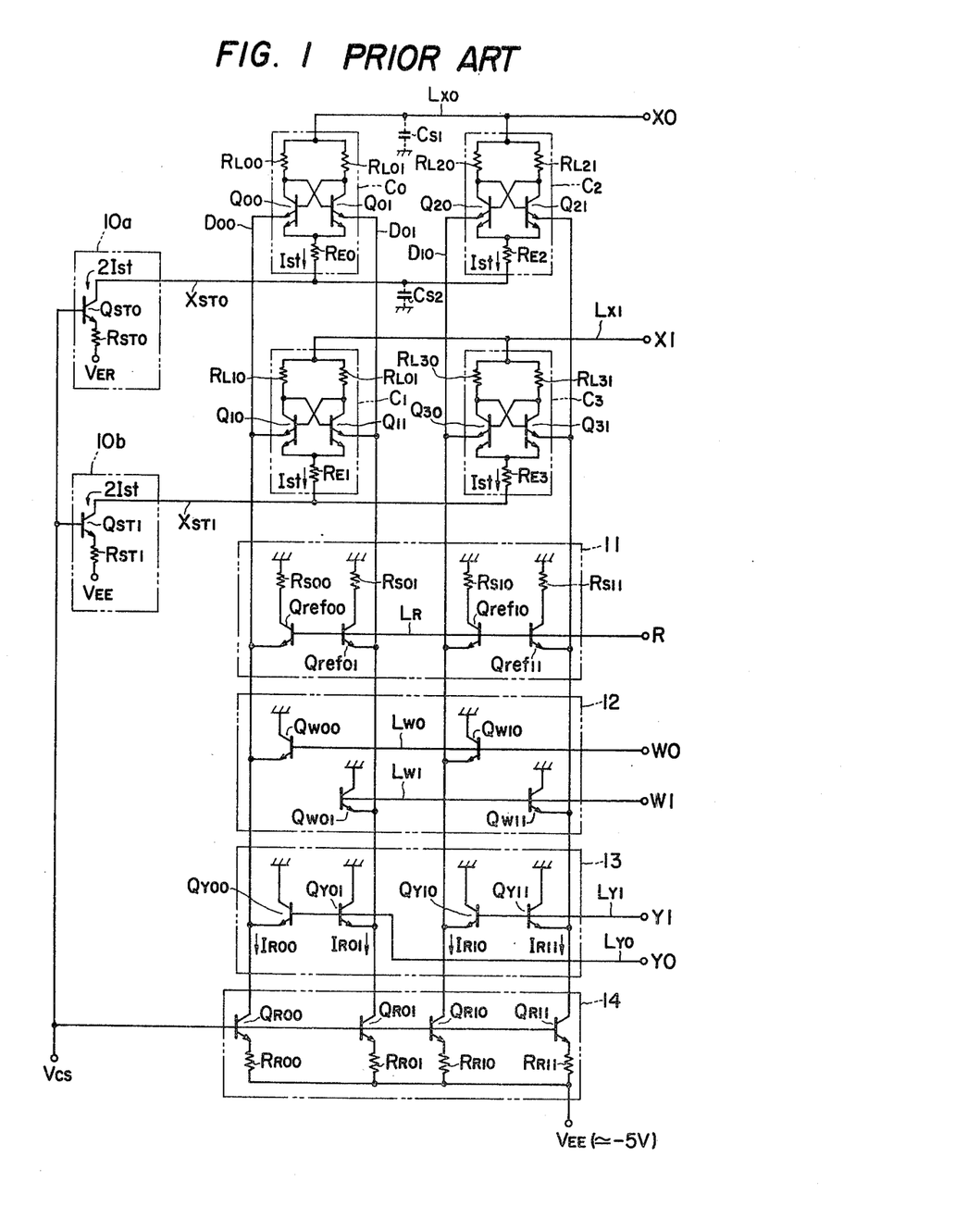
FIG. 1 is a circuit diagram showing a prior art bipolar memory.

For the purpose of better understanding the present invention, a typical prior art bipolar memory will be explained by referring to FIG. 1.

A memory array includes a large number of memory cells arranged in the form of matrix. In FIG. 1 two rows and two columns of the memory cells $C_0$, $C_1$, $C_2$, and $C_3$ are illustrated for ease of explanation.

Each of the memory cells $C_0$ through $C_3$ consists of a pair of cross-coupled transistors. For example, the memory cell $C_0$ consists of transistors $Q_{00}$ and $Q_{01}$ having collectors connected through resistors $R_{L00}$, and $R_{L01}$ to a word line $L_{X0}$ respectively, first emitters connected respectively to digit lines $D_{00}$, $D_{01}$, and second emitters coupled in common. The common emitter of the pair of transistors $Q_{00}$, $Q_{01}$ is connected through a resistor $R_{E0}$ to a constant current source $10_a$ which comprises a transistor $Q_{ST0}$ having a resistor $R_{ST0}$ connected thereto. D.C. voltage $V_{CS}$ is applied to the base electrode of the transistor $Q_{ST0}$ so that the transistor can provide a constant current flowing through a line $X_{ST0}$.

The constant current source $10_a$ is provided for holding the state of each memory cell connected to the two word lines $L_{X0}$ and $X_{ST0}$ by supplying a current necessary for holding its state during its operating cycle.

The other memory cells $C_1$, $C_3$, each comprising a pair of cross-coupled transistors are connected in a similar way to another current source $10b$.

Numerals 11, 12, 13 and 14 denote a sensing circuit, a writing control circuit, a digit addressing control circuit and a constant current source, respectively. The sensing circuit 11 includes a pair of transistors $Q_{ref00}$ and $Q_{ref01}$ connected at their emitter electrodes to the digit lines $D_{00}$ and $D_{01}$ and connected at their base electrodes by way of a line $L_R$ to a terminal R to which a reference voltage is applied.

The writing control circuit 12 includes a transistor $Q_{W00}$ connected at its emitter electrode to the digit line $D_{00}$ and connected at its base electrode via a line $L_{W0}$ to a terminal $W_0$. It also includes a transistor $Q_{W01}$ connected at its emitter electrode to the digit line $D_{01}$ and connected at its base electrode by way of a line $L_{W1}$ to a terminal $W_1$.

The digit addressing control circuit 13 comprises a pair of transistors $Q_{Y00}$ and $Q_{Y01}$, having emitter electrodes connected to the digit lines $D_{00}$ and $D_{01}$ respectively, and base electrodes connected in common to the terminal $Y_0$.

The constant current source 14 includes transistors $Q_{R00}$ and $Q_{R01}$ each having a base electrode connected to DC voltage $V_{CS}$ so that each of the transistors can provide a constant current flowing through each digit line.

The reading operation will now be explained by referring to FIG. 2A.

It is assumed for this discussion that the memory cell $C_0$ is to be selected for reading while the remaining cells such as $C_1$, $C_2$ and $C_3$ are not. The memory cell $C_0$ is arbitrarily defined as storing information of a logic "0" when the transistor $Q_{00}$ is turned on and the transistor is $Q_{01}$ turned off. Alternatively, it is defined as storing a logic "1" when the transistor $Q_{00}$ is turned off and the transistor $Q_{01}$ is turned on. For the purpose of explanation, it is assumed hereinafter that a logic "0" is stored in the memory cell $C_0$.

Figure 2A:
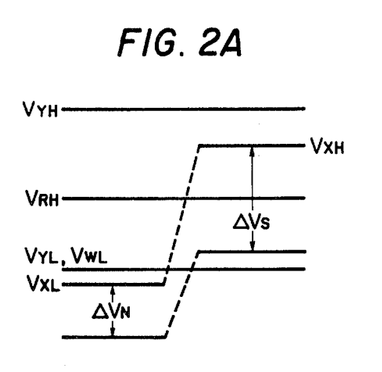
FIGS. 2A and 2B show potentials applied to word lines and digit lines when reading and writing respectively.

During the reading cycle of the selected cell $C_0$, potentials shown at $V_{XH}$, $V_{XL}$, $V_{YL}$, $V_{YH}$ and $V_{RH}$ in FIG. 2A are respectively applied to the terminals $X_0$, $X_1$, $Y_0$, $Y_1$ and $R$. The terminals $W_0$ and $W_1$ are both at the potential shown at $V_{WL}$.

The potential at the collector of the turned-off transistor $Q_{01}$ as well as at the base electrode of the turned-on transistor $Q_{00}$ is nearly equal to potential $V_{XH}$ on the word line $L_{X0}$. On the other hand, the collector electrode of the transistor $Q_{00}$ as well as the base electrode of the transistor $Q_{01}$ is at a potential equal to $(V_{XH}-\Delta V_S)$ volts, where $\Delta V_S$ indicates voltage drop developed across the resistor $R_{L00}$.

The constant current $I_{R00}$ provided by means of the transistor $Q_{R00}$ is permitted to flow through one of transistors $Q_{00}$, $Q_{10}$, $Q_{ref00}$, $Q_{W00}$, $Q_{Y00}$ connected to the digit line $D_{00}$, whose base electrode is at the highest potential. As will be apparent from FIG. 2A, potential $V_{XH}$ on the word line $L_{X0}$, as well as at the base electrode of the transistor $Q_{00}$, is higher than any other potentials at the bases of the transistors $Q_{10}$, $Q_{ref00}$, $Q_{W00}$ and $Q_{Y0}$, so that the current $I_{R00}$ can flow through the transistor $Q_{00}$.

As a result, the transistor $Q_{ref00}$ turns off, thereby developing a high level voltage (equal to ground potential) at the collector thereof.

On the other hand, the constant current $I_{R01}$ provided by means of transistor $Q_{R01}$ flows through either one of transistors $Q_{01}$, $Q_{11}$, $Q_{ref01}$ and $Q_{Y01}$ each connected to the digit line $D_{01}$, whose base electrode is at the highest potential.

The base electrodes of these transistors $Q_{01}$, $Q_{11}$, $Q_{ref01}$ and $Q_{Y01}$ are at potentials of $(V_{XH}-\Delta V_S)$, $V_{XL}$ (or $V_{XL}-\Delta V_N$), $V_{RH}$, $V_{WL}$ and $V_{YL}$ respectively. Therefore, the constant current $I_{R01}$ is permitted to flow through the transistor $Q_{ref01}$ whose base is at a potential higher than any other base potentials of the transistors connected to the digit line $D_{01}$.

As a result, because of the voltage drop developed across the resistor $R_{S01}$, the collector of the transistor $Q_{ref01}$ is held at low potential.

Next it is assumed that the transistor $Q_{00}$ of the memory cell $C_0$ is turned off and the transistor $Q_{01}$ is turned on to store information of a logic "1". In this case, the transistor $Q_{ref00}$ provides low potential at its collector electrode while the transistor $Q_{ref01}$ provides high potential at its collector.

It is understood from the description discussed above that the information stored in the memory cell $C_0$ can be read out as potentials at the collectors of the transistors $Q_{ref00}$ and $Q_{ref01}$.

On the other hand, with respect to the other cells $C_2$ and $C_3$ which are not selected, the following operation is achieved. As discussed before, when the memory cell $C_0$ is selected, a pair of transistors $Q_{Y10}$ and $Q_{Y11}$ are given at their base electrodes a potential $V_{YH}$ which is higher than any other potentials at the base electrodes of the transistors $Q_{20}$, $Q_{30}$, $Q_{ref10}$, $Q_{W10}$, $Q_{21}$, $Q_{31}$, $Q_{ref11}$, and $Q_{W11}$. Consequently, regardless of information stored in the cells $C_2$ and $C_3$, the constant currents $I_{R10}$ and $I_{R11}$ provided by means of the transistors $Q_{R10}$ and $Q_{R11}$ are respectively permitted to flow through the transistors $Q_{Y10}$ and $Q_{Y11}$. As a result, the transistors $Q_{ref10}$, $Q_{ref11}$ both turn off, thereby providing a high level potential (equal to ground potential) at their collectors. This means that information stored in the memory cells $C_2$ and $C_3$ cannot be read out.

Figure 2B:
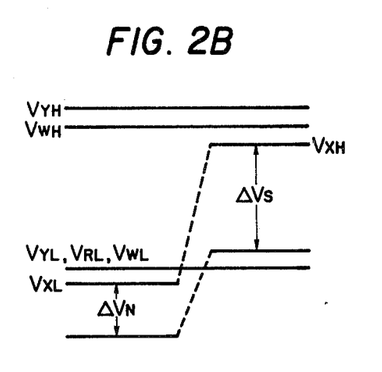

The operation of writing information into a selected memory cell will now be explained by referring to FIG. 2B.

It is assumed for this discussion that the memory cell $C_0$ is selected for writing information of a logic "1". In this case, the terminals $Y_0$, $Y_1$, $X_0$ and $X_1$ are respectively given potentials shown at $V_{YL}$, $Y_{YH}$, $V_{XH}$ and $V_{XL}$ in FIG. 2B. Furthermore, the terminal $W_0$ and $W_1$ are at potentials of $V_{WH}$ and $V_{WL}$ respectively. It is noted that the potential $V_{WH}$ at the base electrode of the transistor $Q_{W00}$ is higher than the potential at the base electrode of the transistor $Q_{00}$ regardless of information stored in the selected cell $C_0$. Therefore, the constant $I_{R00}$ flows through the transistor $Q_{W00}$.

On the other hand, the potential at the base of the transistor $Q_{W01}$ is lower than that at the base of the transistor $Q_{01}$ so that the constant current $I_{R01}$ provided by means of the transistor $Q_{R01}$ is permitted to flow through the transistor $Q_{01}$. Both the constant currents $I_{R00}$ and $I_{R01}$ are usually selected in their values to be larger than the current $I_{st}$ so that the states of the transistors $Q_{00}$ and $Q_{01}$ can be determined by either the current $I_{R00}$ or $I_{R01}$.

In consequence, the transistor $Q_{01}$, through which the constant current $I_{R01}$ flows, is turned on while the transistor $Q_{00}$ is turned off. Thus the writing of a logic "1" into the selected cell $C_0$ is achieved.

In a similar manner, when information of a logic "0" is to be written into the selected cell $C_0$, the potentials $V_{WH}$ and $V_{WL}$ are respectively applied to the terminals $W_0$ and $W_1$ thereby turning the transistor $Q_{00}$ on and turning the transistor $Q_{01}$ off.

The other memory cells not selected, for example the memory cell $C_2$, are not affected by the operation of the writing. Their operation are explained as follows. When the cell $C_0$ is selected, the base electrodes of the transistors $Q_{Y10}$ and $Q_{Y11}$ are at the potential indicated at $V_{YH}$ in FIG. 2B, which is higher than any other potentials at base electrodes of the transistors connected to the digit lines $D_{10}$ and $D_{11}$. Accordingly, the constant currents $I_{R10}$ and $I_{R11}$ flowing into the transistors $Q_{R10}$ and $Q_{R11}$ are permitted to flow through the transistors $Q_{Y10}$ and $Q_{Y11}$ respectively so that they do not affect any influences on the memory cell $C_2$.

As is apparent from the above discussion, the holding of information stored in the memory cell not selected during the operation of reading and writing can be achieved by the constant current $I_{st}$ which is provided by means of the constant current sources $10_a$ and $10_b$. On the other hand, the reading or writing of information out of or into the selected memory cell can be controlled by using the constant current sources $Q_{R00}$, $Q_{R01}$, $Q_{R10}$ and $Q_{R11}$ each providing a constant current $I_R$. In this kind of semiconductor memory, from the viewpoint of access time thereof, it is desirable to stabley and quickly clamp the word lines at a predetermined potential in response to the word addressing pulse applied to the terminal $X_0$, $X_1$.

However, the stray capacity (shown at $C_{S1}$, $C_{S2}$) between each word line and ground, prevents the word lines from being quickly and abruptly clamped. Particularly in the case of using a large number of memory cells for a memory array, both the rising and falling of potential on the word lines are adversely affected by a relatively large value of the stray capacity necessarily existing between the word lines and ground.

Figure 3:
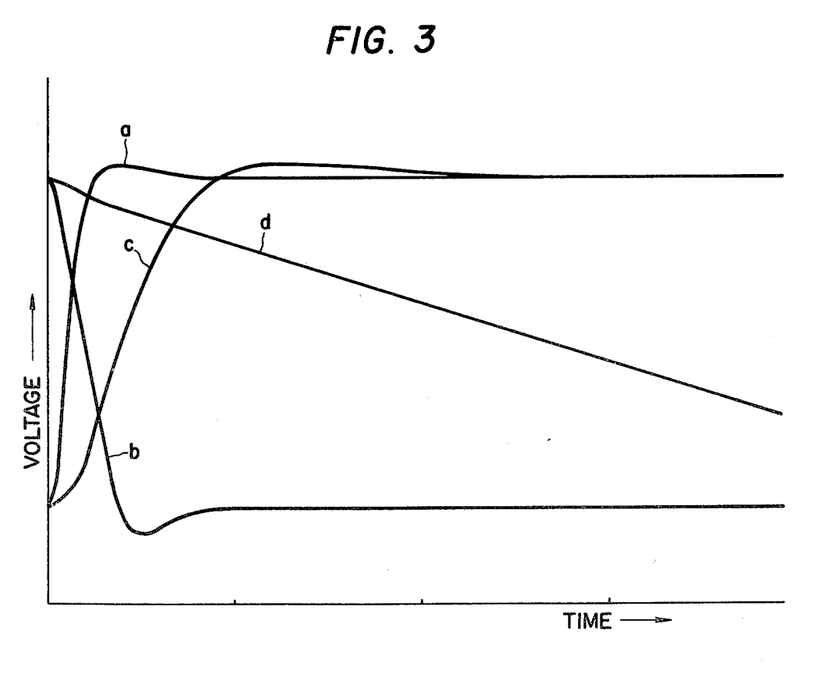
FIG. 3 shows curves of the potential on a word line, which changes in response to the word addressing pulse.

FIG. 3 illustrates waveforms of potential on the word line $L_{X0}$, changing when the potential applied to the terminal $X_0$ is switched from a low level (or high level) to a high level (or low level).

In the case where a small number of memory cells are used for an array, the potential on the word line $L_{X0}$ can abruptly be clamped to a high level when the word addressing pulse is applied, as shown at (a) in FIG. 3. It can also quickly be clamped to a low level when the addressing cycle is completed, as shown at (b) in FIG. 3. However in the case where a large number of memory cells are used for an array, the potential on the word line $L_{X0}$ slowly rises and falls as shown at curves c and d in FIG. 3. With regard to the potential on the other word lines such as $X_{ST0}$, the same tendency as discussed above was observed.

As to the rising of potential on the word line, that prior art provides a successful solution in which the word addressing pulse is applied to the word line through a transistor operating in an emitter follower mode.

However, as far as the falling time of word line potential is concerned, the improvement was considered more difficult to achieve.

PREFERRED EMBODIMENTS OF THE INVENTION

A semiconductor memory embodying the present invention will be explained by referring to FIG. 4 in which the same symbols and numerals as in FIG. 1 denote like elements.

Figure 4:
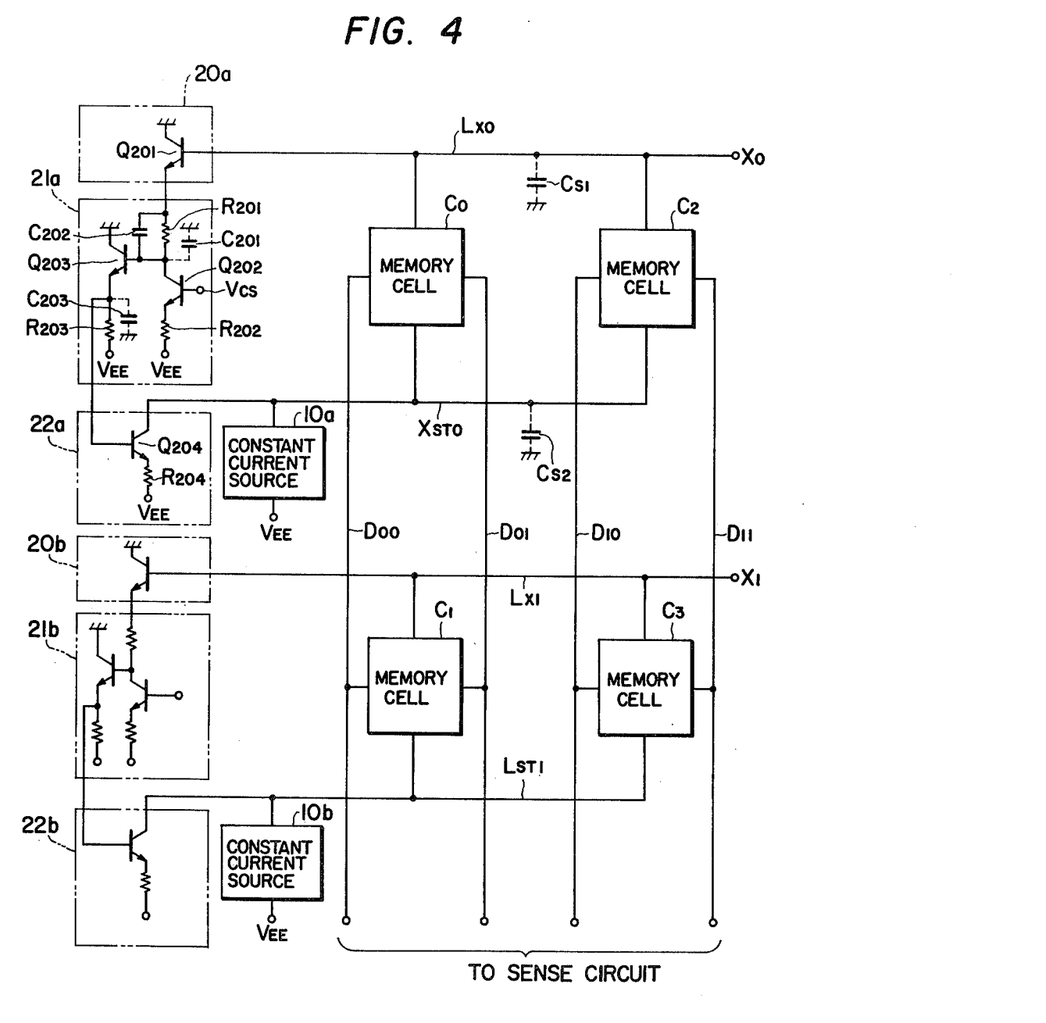
FIG. 4 is a circuit diagram showing one embodiment of the present invention.

In FIG. 4, the terminal $X_0$ is connected by way of the word line $L_{X0}$ to a signal detecting circuit $20_a$ comprising an emitter follower transistor $Q_{201}$. This transistor $Q_{201}$ functions to detect the application of the word addressing pulse to the terminal $X_0$. The output from the detecting circuit $20_a$ is then introduced into a delay circuit $21a$ which includes transistors $Q_{202}$ and $Q_{203}$.

The detected output signal from circuit $20a$ flows through a resistor $R_{201}$, a collector-emitter path of the transistor $Q_{202}$ and a resistor $R_{202}$ to a D.C voltage source $V_{EE}$. By the voltage drop developed across the resistor $R_{201}$, an appropriate potential is applied to the base electrode of the emitter follower transistor $Q_{203}$. The potential at the base electrode of the transistor $Q_{203}$ can arbitrarily be determined by the proper selection of both values of the emitter resistor $R_{202}$ and the base potential of the transistor $Q_{202}$. In response to the signal applied, the delay circuit $21_a$ produces an output with a delay time which can be arbitrarily determined by the proper selection of values of the resistors $R_{201}$ and $R_{203}$, because these resistors serve in conjunction with stray capacitances $C_{201}$ and $C_{203}$ as determining the time constant of the delay circuit $21_a$. In practice, a speed up capacitor $C_{202}$ may be connected in parallel with the resistor $R_{201}$ to cancel the effect of the stray capacity $C_{201}$, if the desired delay time can be obtained by means of the resistor $R_{203}$ and the stray capacity $C_{203}$.

The delayed signal from circuit $21a$ is then applied to a current switch circuit $22_a$ which comprises a transistor $Q_{204}$ having an emitter connected through a resistor $R_{204}$ to DC voltage source, and a collector connected to the line $X_{ST0}$.

Numerals $20_b$, $21_b$ and $22_b$ respectively denote a detecting circuit, a delay circuit and a current switch circuit which are of the same configurations as discussed above.

In operation of the memory system shown in FIG. 4, when one of memory cells, for example $C_0$ is to be selected for either writing or reading, a high potential $V_{XH}$ is applied to the terminal $X_0$. During this writing or reading cycle, the stray capacitances $C_{S1}$ and $C_{S2}$ may be charged up. Upon the completion of the writing or reading cycle, the terminal $X_0$ is returned to a low potential $V_{HL}$.

Figure 5:
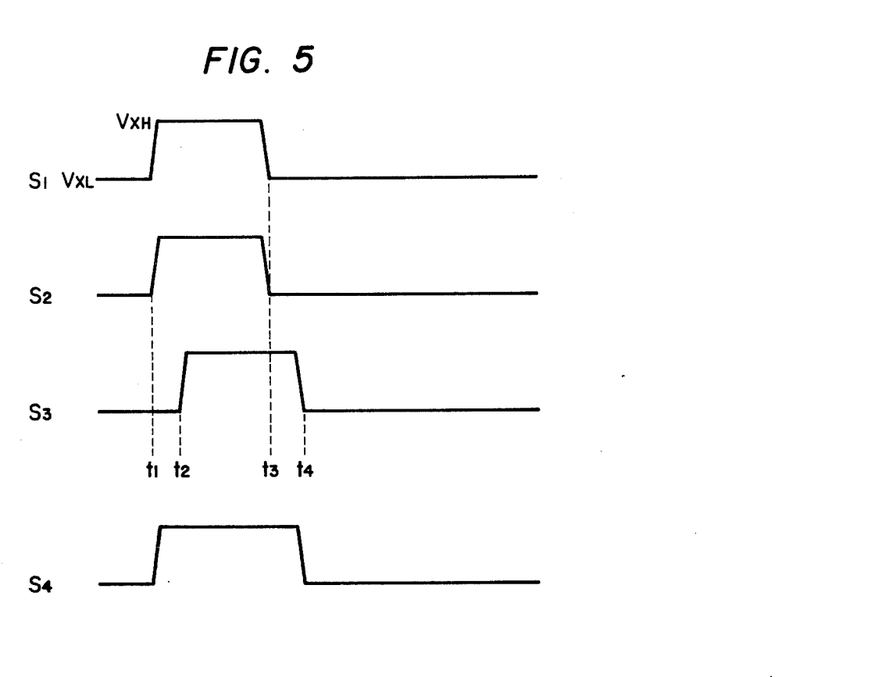
FIG. 5 shows waveforms at various points in FIG. 4.

The transistor $Q_{201}$ detects the application of the word addressing pulse $S_1$ shown in FIG. 5 and produces an output signal $S_2$ at its emitter.

After the predetermined delay time, a signal $S_3$ appears at the emitter of the transistor $Q_{203}$ in response to the signal $S_2$. The signal $S_3$ is introduced into the current switch circuit $22_a$. As long as the output of the transistor $Q_{203}$ applies current, the transistor $Q_{204}$ is turned on thereby permitting an increased current flowing through the selected word line $X_{ST0}$. Since this additional current flows only through the selected word line connected to the selected cell, its amplitude can be much greater than that of the constant current $I_{ST0}$ provided by the source $10_a$.

It should be noted that the supply of the current flowing during the period of time from $t_3$ to $t_4$ just aftr the completion of the reading or writing cycle ($t_1$ to $t_3$) serves to pull the charges out of the stray capacitances $C_{S1}$ and $C_{S2}$ and discharge them into ground so that the word lines can be quickly clamped to low potential. The most important thing to be considered in the present invention is that after the terminal $X_0$ is returned to a low level potential $V_{XL}$, the transistor $X_{204}$ still continues to be turned on for the predetermined period of time equal to the delay time of the delay circuit $102_a$. For this period of time, the charges stored in the stray capacitances can be abruptly discharged by way of the transistor $Q_{204}$ with the result that the rapid falling of the potentials on the word lines can be achieved.

Figure 6:
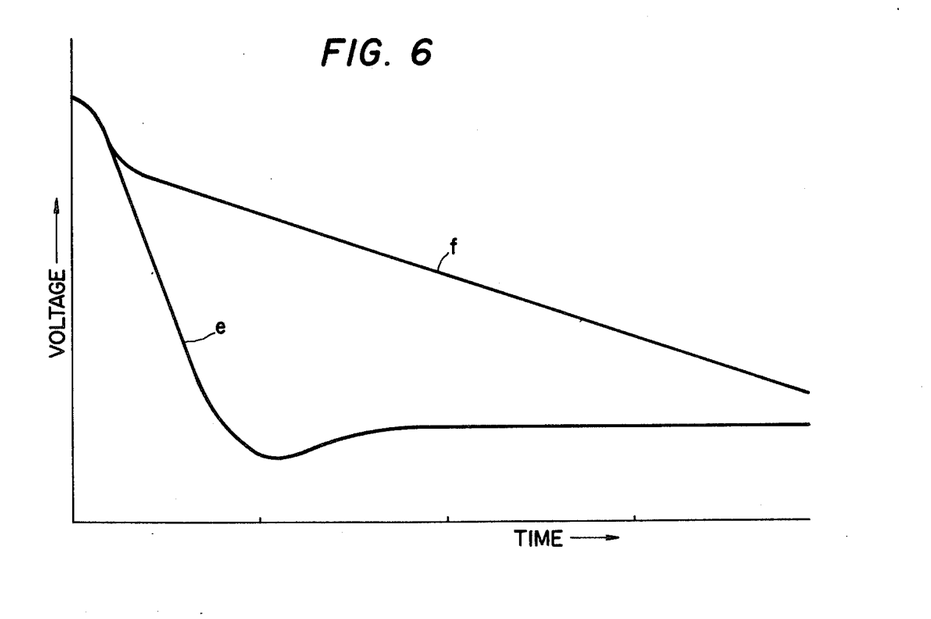
FIG. 6 shows curves of the potential on a word line.

Measurements have shown that according to the embodiment of FIG. 4, the potential on the word line $L_{X0}$ quickly reaches a low level in response to the switching of potential at the terminal $X_0$ from a high level to a low level, as shown at e in FIG. 6.

On the other hand, if the transistor $Q_{204}$ turns on only during the same period of time as the reading or writing cycle for the selected cell, so that in addition to the current $I_{st}$, the further current may be provided by means of the transistor $Q_{204}$ to the selected word line, the falling of potential on the word line is insufficiently improved as shown at f in FIG. 6.

It is to be understood that in the embodiment of FIG. 4 some variations may be made without departing from the essential features of the invention.

For example, while the detecting circuit $20_a$ is used for detecting the switching of potential applied to the word line in FIG. 4, it is, of course, possible to use an output from a voltage generating circuit (not shown) employed for a word line addressing. Furthermore, instead of using the delay circuit $21_a$, a circuit for enlarging a width of a pulse applied thereto can be connected between the detecting circuit $20_a$ and the current switch circuit $22_a$. In this case, a signal waveform applied to the current switch circuit $22_a$ is indicated as shown at $S_4$ in FIG. 5.

In the embodiment of FIG. 4, since the resistors $R_{201}$ and $R_{203}$ are usually selected to have large values to provide the predetermined delay time, the power consumption by the delay circuit $20_a$ is relatively small.

Figure 7:
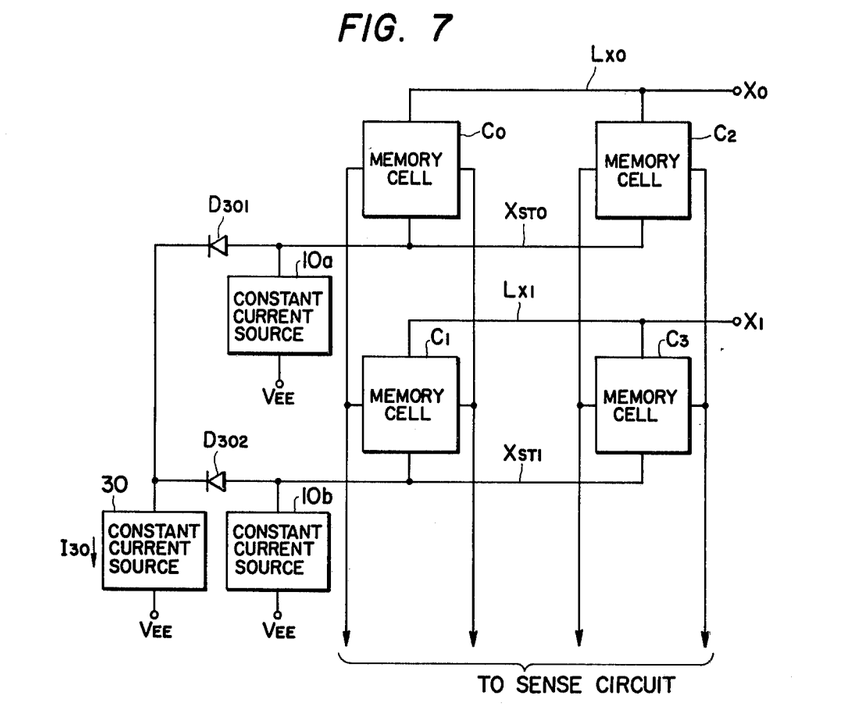
FIGS. 7, 8 and 9 are circuit diagrams, each showing other embodiments of the present invention.

FIG. 7 shows a second embodiment of the present invention, in which word lines $X_{ST0}$, $X_{ST1}$ are connected respectively through diodes $D_{301}$, $D_{302}$ to a common constant current source 30.

This embodiment is characterized by the use of a diode having a relatively long recovery time. The recovery time is defined as the period of time during which the diode continues to be turned on after the forward voltage across it is removed. Since this kind of diode is well known to those skilled in this art, the detailed description of the structure thereof is not shown.

When no memory cell is selected for either writing or reading, all the diodes are turned off because they are all reversely biased. However, when one of the memory cells, for example $C_0$ is selected, potential on the line $X_{ST0}$ connected thereto becomes higher than that on the other lines not selected, as will be apparent from FIGS. 2A and 2B. Thus only the diode $D_{301}$ is forward biased.

Upon the completion of the writing or reading cycle for the selected cell $C_0$, the line $X_{ST0}$ is returned to a low potential causing the diode $D_{301}$ to be again reversely biased.

It is noted that the diode $D_{301}$ becomes turned off with a delay time so that the constant current $I_{30}$ can still flow through the diode $D_{301}$ for the predetermined time after the completion of reading or writing cycle for a selected cell.

As discussed before, the supply of the such current $I_{30}$ serves to abruptly discharging the charges stored in the stray capacitances into ground so that a relatively quick falling of potential on the word lines $L_{XO}$ and $X_{STO}$ can be accomplished.

In practice, the embodiment of FIG. 7 is characterized by the simplicity of its circuit configuration and small power consumption necessary for providing the constant current.

Figure 8:
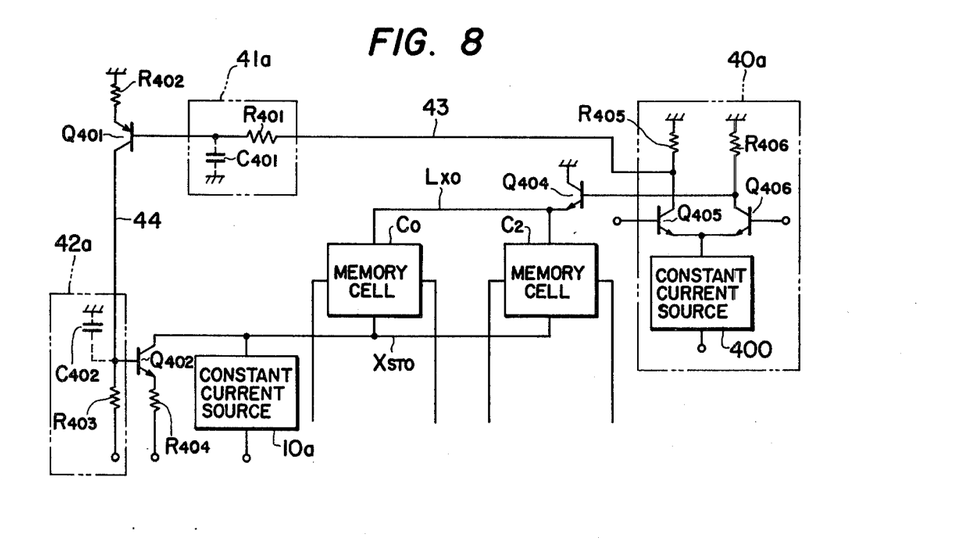

FIG. 8 shows a third embodiment of the present invention. A word addressing pulse generating circuit $40_a$ comprises a pair of transistors $Q_{405}$ and $Q_{406}$. Between the collector electrodes of the transistors $Q_{405}$, $Q_{406}$ and ground, resistors $R_{405}$ and $R_{406}$ are respectively connected. The emitters coupled in common are connected to a constant current source 400. A low potential is applied to one of the base electrodes of the transistors $Q_{405}$, $Q_{406}$ and a high potential is applied to the other. The output from the collector of the transistor $Q_{406}$ is applied to the word line $L_X$ by way of an emitter follower transistor $Q_{404}$.

The output derived from the collector of the other transistor $Q_{405}$ is applied to a delay circuit $41_a$ consisting of a resistor $R_{401}$ and a capacitor $C_{401}$ and then introduced into the base electrode of a PNP type transistor $Q_{401}$. A signal appearing at the collector of the transistor $Q_{401}$ is applied to a current switch transistor $Q_{402}$ by way of another delay circuit $42_a$ including a capacitor $C_{402}$ and a resistor $R_{403}$.

In actual practice, the connection of either one of the delay circuits $41_a$, $42_a$ may be sufficient to obtain the desired delay time. Furthermore, stray capacitances between the lines 43, 44 and ground may be used instead of connecting the capacitors $C_{401}$, $C_{402}$.

In the case where the particular type of transistor has a slow response characteristics, such when a lateral PNP type transistor is used as the transistor $Q_{401}$, no additional delay circuit will be needed.

When the memory cell $C_O$ is selected for either writing or reading, a low level voltage is derived from the collector of the transistor $Q_{405}$, while a high level voltage is applied to the word line $L_{XO}$. The low level voltage applied to the transistor $Q_{401}$ causes it to turne on. The output appearing at the collector of the transistor $Q_{401}$ is applied to the base electrode of the transistor $Q_{402}$ thereby turning it on to provide an additional current to the selected word line $L_{XO}$.

Upon the completion of the reading or writing cycle for the selected cell $C_O$, the word line $L_{XO}$ is returned to a low potential, and the transistor $Q_{405}$ produces a high level output at its collector.

However, due to the delay time provided by means of the circuit $41_a$ and $42_a$, the transistor $Q_{402}$ continues to be turned on for a while after the completion of the reading or writing cycle. Accordingly, the same operation as discussed before with reference to FIGS. 4 and 7 can be achieved.

Figures 9, 10:
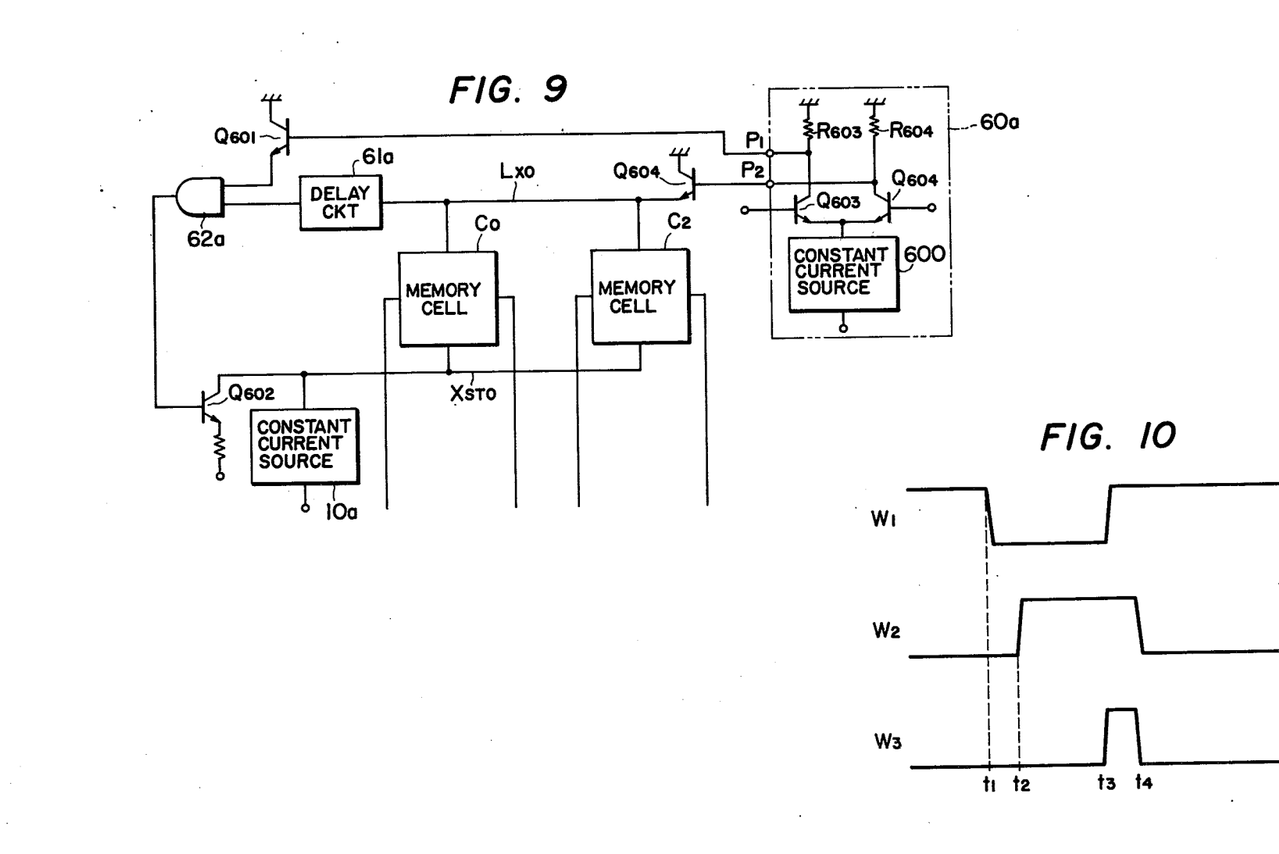
FIG. 10 shows waveforms at various points in FIG. 9.

In FIG. 9 showing a fourth embodiment of the present invention, one of outputs from the word addressing signal generating circuit $60_a$ is directly applied to an emitter follower transistor $Q_{601}$, and the other output of reverse phase is applied to a delay circuit $61_a$ through a transistor $Q_{604}$. Both the signals from the transistor $Q_{601}$ and the delay circuit $61_a$ are applied to a gate $62_a$ to produce an AND logic output which is applied to a current switch transistor $Q_{602}$.

It is again assumed that the memory cell $C_O$ is selected for either writing or reading. The circuit $60_a$ produces at a terminal $P_1$ an output $W_1$ and at a terminal $P_2$ an output $W_2$ as shown in FIG. 10. The signal at the terminal $P_2$ is delayed by the circuit $61_a$ for the desired time and then applied to the AND gate $62_a$. Accordingly, the AND gate $62_a$ produces an output as shown at $W_3$ in FIG. 10, which is applied to the current switch transistor $Q_{602}$. As long as the output from the AND gate $62_a$ is being applied to the transistor $Q_{602}$, its transistor turns on so as to provide an additional current to the selected word line $L_{XO}$. It should be noted, in this embodiment that the additional current is allowed to flow only during the time from $t_3$ to $t_4$ rather than the period of time from $t_2$ to $t_4$. However for the purpose of achieving the quick falling of potentials on the word lines $L_{XO}$ and $X_{STO}$, such period of time is effectively sufficient. The foregoing description is directed to one type of a bipolar memory array, but the present invention may, of course, be adapted to any other type of memory array.

Figure 11:
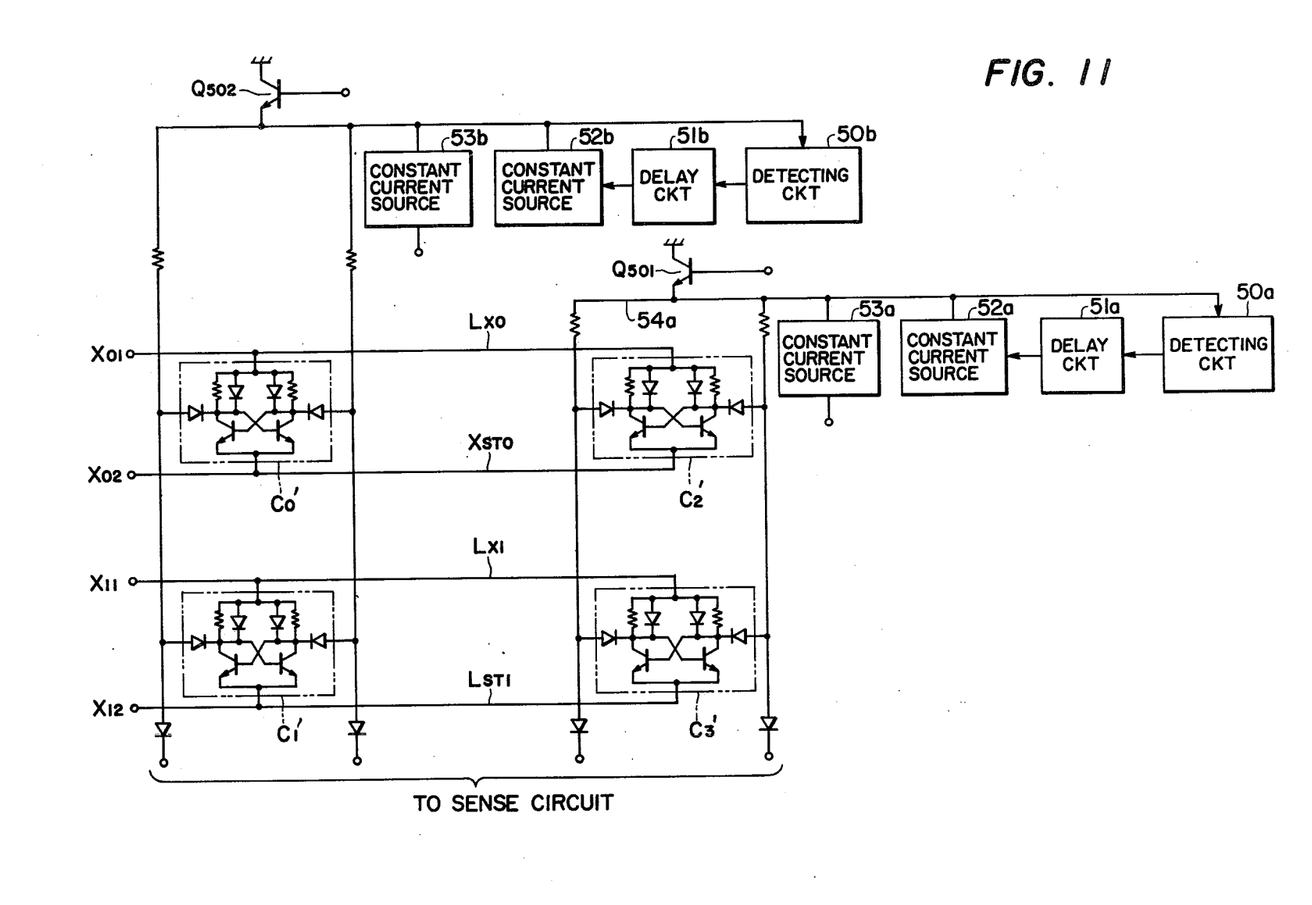
FIG. 11 is a circuit diagram illustrating another embodiment of the present invention.

For example, FIG. 11 shows a fifth embodiment of the present invention, in which a different type of memory cell is used. Since the circuit configuration of such memory cell is well known, its detailed description will be omitted.

When the memory cell $C_O'$ is selected, the transistor $Q_{501}$ is turned on and the other transistor $Q_{502}$ turned off. Upon the completion of selection of the memory cell $C_O'$, the transistor $Q_{501}$ is returned to its turned off state. However, at the time of the switching of the transistor $Q_{501}$ from on to off, the slow falling of potential on the line $54_a$ prevents the memory from being operated at a high speed.

In order to solve this problem, the same circuit arrangement as described with reference to FIG. 4 may be used. Blocks $50_a$, $51_a$ and $52_a$ denote respectively a detecting circuit, a delay circuit and a current switch circuit. These elements are of the same circuit configuration as in FIG. 4 and may operate in the same manner to provide the additional current to the selected word line. It will be appreciated therefore that this embodiment also achieves the quick falling of potential on the selected line. It is to be understood that the above-identified arrangements are simply illustrative of the application of the principles of this invention. This invention is not limited to the particular details of connections described and various variations can be readily made without departing from the essential features of invention. It is accordingly desired that the appended claims be given a broad interpretation commensurate with the scope of the invention within the art.

We claim:

1. A semiconductor memory comprising:
   a memory array including a number of memory cells arranged in the form of a matrix, each memory cell being connected between a first word line to which a word line addressing pulse is applied and a second word line to which a constant current source is connected;
   first means for detecting said word line addressing pulse applied to the first word line;
   second means, connected to said detecting means, for producing a signal, based upon said detected signal, appearing for a predetermined period of time at least just after the application of the word line addressing pulse to the selected word line;
   a current switch means, connected to said second word line, for allowing a current to flow through the memory cells connected to the selected word line in addition to a current provided by means of said constant current source; and
   third means for applying the output from the second means to said current switch means thereby turning it on for said predetermined period of time.

2. A semiconductor memory as defined in claim 1 wherein said second means comprises a delay circuit for delaying an output of the first means.

3. A semiconductor memory as defined in claim 1 wherein said second means comprises a circuit for enlarging a width of an output signal of the first means.

4. A semiconductor memory as defined in claim 1, wherein said first means is connected to one terminal of the first word line, opposite to the terminal of said first word line to which the word addressing voltage is applied.

5. A semiconductor memory as defined in claim 1, wherein the word line addressing pulse generating circuit includes a pair of transistors emitters commonly coupled to a constant current source, the addressing voltage being derived from the collector of the one of transistors.

6. A semiconductor memory as defined in claim 5, wherein the first means comprises means for deriving a voltage from the collector of the other transistor.

7. A semiconductor memory as defined in claim 6 in which the second means comprises;
   means for delaying a signal on the word line; and
   means for producing an AND logic output of said delayed signal and the output from the first means.

8. A semiconductor memory comprising:
   a memory array including a number of memory cells arranged in the form of a matrix, each memory cell being connected between a first word line to which a word line addressing voltage is applied and a second word line to which a constant current source is connected;
   a plurality of diodes, each having a relatively long recovery time, connected to the second word line for detecting changes in potential on the second word line, each diode being turned on when the word line addressing voltage is applied to the first word line; and
   a constant current source, connected to all the diodes, for providing a current flowing through one of the diodes to the selected memory cell.

9. A semiconductor memory as defined in claim 8, wherein the recovery time of said plurality of diodes is sufficiently long to continue to apply current to the memory cells from the constant current source connected to the diodes for a sufficient period of time following the completion of a word line addressing pulse to discharge stray capacitances on the word lines.

10. A semiconductor memory as defined in claim 1, wherein said predetermined period of time includes a sufficient period of time following the completion of a word line addressing pulse to allow the additional current provided by the current switch means to discharge stray capacitances on the word lines.

11. A semiconductor memory as defined in claim 6, wherein the first means includes a sensing transistor coupled to the collector of said other transistor, and the second means includes a first delay means coupled between the sensing transistor and the collector of said other transistor and a second delay means coupled between the sensing transistor and the current switch means.

* * * * *